United States Patent [19]

Shiota

[11] Patent Number: 5,672,951
[45] Date of Patent: Sep. 30, 1997

[54] DETERMINATION AND CONTROL OF BATTERY STATE

[75] Inventor: Hisashi Shiota, Amagasaki, Japan

[73] Assignee: Mitsubishi Denki Kabushiki Kaisha, Tokyo, Japan

[21] Appl. No.: 529,396

[22] Filed: Sep. 18, 1995

[30] Foreign Application Priority Data

Nov. 4, 1994 [JP] Japan .................................. 6-271376

[51] Int. Cl.$^6$ .................................................. H01M 10/46
[52] U.S. Cl. .................................. 320/5; 320/48; 320/43; 324/428; 324/430
[58] Field of Search ................................ 320/5, 30, 39, 320/43, 48; 324/426, 427, 428, 430, 432; 340/635, 636; 429/90

[56] References Cited

U.S. PATENT DOCUMENTS

| | | | |
|---|---|---|---|
| 4,678,998 | 7/1987 | Muramatsu | 320/48 X |
| 4,876,513 | 10/1989 | Brilmyer et al. | 320/48 X |
| 4,952,862 | 8/1990 | Biagetti et al. | 320/48 |
| 5,274,321 | 12/1993 | Matsuda | 320/31 |
| 5,281,919 | 1/1994 | Palanisamy | 324/427 |
| 5,281,920 | 1/1994 | Wurst | 320/48 X |
| 5,325,041 | 6/1994 | Briggs | 320/48 X |
| 5,352,968 | 10/1994 | Reni et al. | 320/48 X |
| 5,457,377 | 10/1995 | Jonsson | 320/48 X |

FOREIGN PATENT DOCUMENTS

| | | |
|---|---|---|
| 37 12 629 | 10/1987 | Germany . |
| 3163375 | 7/1991 | Japan . |
| WO90/10242 | 9/1990 | WIPO . |

OTHER PUBLICATIONS

"Kouseinou Denchi No Saishin Gijutsu Manyual (Manual Concerning Up-To-Date Technology Of High Performance Battery)", published by Sougou Gijutsu Center Co. of Japan, pp. 178–181 and 196–197. no date.

"Denkikagaku Sokutei Hou (Electrochemical Measurements Methods)", A. Fujishima et al, published by Gihoudou Publishing Company of Japan, pp. 271–273. 1984.

"Lithium Ion Rechargeable Battery", Sony Energytec, Inc., 1993.

Primary Examiner—Edward Tso
Attorney, Agent, or Firm—Burns, Doane, Swecker & Mathis, LLP

[57] ABSTRACT

A technique for measuring battery characteristics comprises measuring a battery terminal voltage, a charge/discharge current and a charge/discharge time. The technique entails arithmetically determining an integrated power, an integrated charge quantity and an integrating time interval over a period extending from a start of a charge/discharge process to an end thereof, determining a mean terminal voltage by dividing the integrated power by the integrated charge quantity, determining a mean charge current by dividing the integrated charge quantity by the integrating time interval, determining a polarization resistance of the battery on the basis of the mean terminal voltage and the mean current by using a battery polarization resistance model, and finally determining an open-circuit voltage of the battery on the basis of the polarization resistance. The information culled from the above technique may be used to control a charge/discharge process and to predict the remaining life of the battery.

11 Claims, 9 Drawing Sheets

RESIDUAL CAPACITY Cr (%)

DETERMINATION AND CONTROL OF BATTERY STATE

BACKGROUND OF THE INVENTION

1. Field of the Invention

The present invention generally relates to a method of measuring parameters of secondary batteries, a method of controlling charge/discharge of secondary batteries by using the parameters as measured, a method of predicting the life of secondary batteries on the basis of the measured parameters, an apparatus for controlling the charge/discharge process of the secondary batteries and an electric power storage apparatus implemented by using the same. More specifically, the present invention is concerned with a secondary battery parameter measuring method capable of measuring easily and accurately parameters of secondary batteries, a method for controlling the secondary battery so that the life thereof can effectively be extended and a method for predicting the life of a secondary battery, by using the measured parameters. Further, the present invention is directed to a charge/discharge control apparatus for carrying out the charge/discharge control method and an electric energy storing apparatus implemented by utilizing the charge/discharge control apparatus.

2. Description of Related Art

Secondary batteries have been developed for the universal purpose of storing (charging) of electric energy and supplying (discharging) thereof even though they may differ from one to another in respect to the size or capacity and application for which they are designed. Of course, this holds true essentially for all the secondary batteries inclusive of the conventional secondary batteries and nickel-cadmium batteries as well as nickel-hydrogen batteries and lithium secondary batteries developed in recent years and exhibiting excellent charge/discharge characteristics.

In order to control repetitively control the charge/discharge cycles with high efficiency to thereby extend or lengthen the use life of the secondary battery to a possible maximum, it is required to previously obtain precise information concerning the parameters of the secondary battery such as those exemplified by a polarization resistance (i.e., resistance upon polarization) R and an open-circuit voltage Voc. Parenthetically, with the terms "life or use life" as used herein, it is intended to mean a number of times the charge/discharge cycle of the secondary battery can effectively be repeated until the end of life thereof. Thus, the use life or life may also be referred to as the effective charge/discharge cycle repeatable number or as the life cycle number.

In general, the polarization resistance R of the secondary battery can be represented as a function of parameters such as environmental or ambient temperature at which the secondary battery are operated and charge/discharge history such as charge/discharge cycle repetition number NC (i.e., the number of times the secondary battery has been repetitively charged and discharged in the past), as well as the types and structures of the batteries. However, so long as the variation in the polarization resistance R of the secondary batteries of a same type and a same structure is concerned, the polarization resistance R may be considered to be substantially constant independent of the temperature except for the case where the secondary battery is exposed to an environment, in which the temperature changes in an exceptional manner.

FIG. 12 is a characteristic diagram for graphically illustrating characteristics of the polarization resistance R actually measured in a lithium secondary battery of lithium ion type as a functional of variation in the ambient temperature. In this figure, the ambient temperature (room temperature) of the lithium secondary battery is taken along the abscissa with the polarization resistance R ($\Omega$) thereof being taken along the ordinate.

As can be seen from FIG. 12, so far as the change of the room temperature lies within a range of ±5° C., variation of the polarization resistance R is on the order of 0.1$\Omega$. For practical applications, the change of the polarization resistance R of this order may be regarded as constant.

Further, a relation between an open-circuit voltage Voc and a residual capacity Cr of the secondary battery can also be experimentally determined.

FIG. 13 is a characteristic diagram illustrating graphically a relation between a residual capacity Cr and an open-circuit voltage Voc of a lithium secondary battery. In the figure, a relative residual capacity Cr (in %) is taken along the abscissa with the open-circuit voltage Voc (in volts) being taken along the ordinate. This characteristic diagram clearly shows that the open-circuit voltage Voc becomes low as the residual capacity Cr decreases.

Additionally, it is noted that an absolute discharge capacity Cd of the secondary battery may possibly become low as the number of repetitions of the charge/discharge operation cycles of the secondary battery increases.

FIG. 14 is a characteristic diagram illustrating a relation between a charge/discharge cycle repetition number NC and a discharge capacity Cd (substantially coinciding with a charge capacity Cc) of a secondary battery. In this figure, the charge/discharge cycle repetition number NC is taken along the abscissa while an intrinsic discharge capacity Cd (%) of the secondary battery is taken along the ordinate.

As can be seen from FIG. 14, the discharge capacity Cd decreases as the charge/discharge cycle repetition number NC increases. Parenthetically, it should be noted in conjunction with the characteristic diagram of FIG. 14 that the charge and discharge of the secondary battery are conducted with a constant current by imposing an upper limit to the charging voltage. The reason why the discharge capacity Cd deceases can be explained by the fact that the insufficient charging is repeated in order to protect the secondary battery against the overdischarge.

As is obvious from the characteristic diagrams shown in FIGS. 13 and 14, the fact that a secondary battery exhibits a same open-circuit voltage Voc at both the beginning and the end of a series of a predetermined number of charge/discharge cycles as repeated (i.e., a series of a predetermined number of times the secondary battery is charged and discharged repetitively) does not necessarily indicate that the absolute discharge capacity Cd and the residual capacity Cr remain the same at the respective intrinsic values.

By way of example, let's suppose that the discharge capacity Cd decreases to about 50% after six hundred repetitions of charge/discharge cycles (see FIG. 14). In that case, the open-circuit voltage Voc is at 4 volts (see FIG. 13) which is equivalent to the residual capacity Cr of 10%. However, the absolute discharge capacity of the secondary battery of concern decreases to about a half when compared with the discharge capacity Cd (=100%) at the beginning of the series of the predetermined number of the charge/discharge cycles as repeated (see FIG. 14).

Concerning the states of the secondary batteries immediately after the manufacture thereof, it can be said in general that the lead battery is in the charged state while the nickel-hydrogen battery is in the discharged state. Thus, it depends on the types of the secondary batteries whether the charge/discharge repetition cycle thereof should begin with the charging or the discharging.

In any case, the secondary battery is repeatedly charged and discharged. In this content, it will readily be understood that as the charge/discharge cycle repetition number NC increases, the power capacity of the secondary battery decreases in dependence on the life cycle number or effective charge/discharge cycle repeatable number NL. In other words, the life cycle number or the effective charge/discharge cycle repeatable number NL indicates the upper limit of the charge/discharge cycle repetition number NC which remains available.

In general, as the intrinsic factors which determine the life cycle number or the effective charge/discharge cycle repeatable number NL of the secondary battery, there may be mentioned the overcharge and overdischarge in most of the secondary batteries although it certainly depends on the types of the secondary batteries.

Under the circumstances, there has heretofore been proposed a charge/discharge control for evading the overcharge as well as the overdischarge as one of the effective measures for extending or elongating the life of the secondary battery, i.e., for increasing the effective charge/discharge cycle repeatable number NL.

Similarly, a so-called secondary reaction of the secondary battery which differs from the intrinsic reaction thereof and which is considered as one of the factors impairing the life or effective charge/discharge cycle repeatable number NL takes place frequently under excessive polarization. Accordingly, it is important to effect the charge/discharge control such that the excessive polarization is prevented from occurrence.

As one of the basic charging methods for extending or lengthening the life or effective charge/discharge cycle repeatable number NL in practical applications, there may be mentioned a constant-voltage/constant-current method for a lead battery; used as the secondary battery. For more particulars in this context, reference may be made, by way of example, to a Japanese literature entitled "KOUSEINOU DENCHI NO SAISHIN GIJUTSU MANYUAL (MANUAL CONCERNING UP-TO-DATE TECHNOLOGY OF HIGH PERFORMANCE BATTERY)" published by Sougou Gijutsu Center Co. of Japan, p. 178. According to this known method, the secondary battery is charged with a constant current when the terminal voltage V of the lead battery is lower than a predetermined voltage level, whereas after the terminal voltage V has reached the predetermined voltage level, the charge current is so controlled so that the predetermined voltage mentioned above is not exceed, to thereby allow the secondary battery to be charged for a predetermined time period.

Furthermore, when the nickel-cadmium battery is used as the secondary battery, there may be mentioned a constant current charge method which is also known as a $-\Delta V$ method or voltage change detecting charge method. For more particulars, reference may be made to the literature mentioned previously, page 196. According to this known method, the timing at which the charging of the nickel-cadmium battery is to be ended is detected by making use of a voltage change phenomenon which is known as a characteristic inherent to the nickel-cadmium battery and which takes place at the end or in the vicinity of completion of the charging process. More specifically, as the charging process comes closer to the end, the terminal voltage V of the nickel-cadmium battery, which increases progressively during the charging cycle drops transiently and again rises up. This phenomenon is termed the voltage change phenomenon.

On the other hand, when a lithium-ion type battery (i.e., lithium secondary battery) developed recently is used as the secondary battery, there may be adopted the constant voltage/constant current charge method described hereinbefore in conjunction with the charging of the lead battery. In this connection, reference may be made to a Japanese literature entitled "Catalogue of Sony Energetic Lithium Ion Type Battery" for more information.

On the other hand, in conjunction with the discharge process of the secondary battery, it is generally accepted that a voltage drop of the terminal voltage V to a predetermined level (lower limit value) indicates a timing at which the discharge cycle of the secondary battery is to be ended, regardless of the types of the secondary batteries.

However, the predetermined voltage level mentioned previously is set high for the secondary battery of a low discharging rate when compared with that of the secondary battery exhibiting a high discharging rate (i.e., those capable of discharging with a large discharge current). This is because the voltage drop due to the polarization resistance R ($\Omega$) is large in the case of the secondary battery having a high discharging rate when compared with the voltage drop of the secondary battery whose discharging rate is low, and because the secondary battery of high discharging rate is expected to have a greater residual capacity Cr (%) than those of low discharging rate. Accordingly, the secondary battery having a high discharging rate is regarded to have still an adequate residual capacity Cr even when the terminal voltage drops to the predetermined level for the secondary battery of a low discharging rate. The discharging capability of the former is regarded as coming to an end when the terminal voltage thereof drops to another predetermined lower level.

As is apparent from the above description, according to the charge/discharge control for the secondary batteries known heretofore, the terminal voltage V is monitored, wherein the charge/discharge current control for the secondary batteries is triggered when the terminal voltage V has attained the certain terminal voltage level determined previously for each of various types of the secondary batteries.

However, it is difficult with the control methods known heretofore to avoid the possibility of the secondary batteries being overcharged and/or overdischarged. More specifically, the terminal voltage V appearing during the charge/discharge process can be given by a sum of the open-circuit voltage Voc related to the residual capacity Cr and an overvoltage related to a product of the charge/discharge current I and the polarization resistance R ($\Omega$). In this case, it is noted that the overvoltage is not constant. Consequently, monitoring of the terminal voltage V can not lead to the monitoring of the residual capacity Cr which bears a relation to the open-circuit voltage Voc.

Parenthetically, the overvoltage can actually be measured and given by a difference between the open-circuit voltage Voc and the terminal voltage V (i.e., overvoltage=Voc−V).

The reason why the overvoltage is not constant can be explained by the fact that the polarization resistance R varies from one secondary battery to another and that it varies as the charge/discharge cycles progresses even in the case of one and the same secondary battery.

FIG. 15 is a characteristic diagram for graphically illustrating variation of the polarization resistance R of two different secondary batteries as a function of the charge/ discharge cycle repetition number NC. More specifically, FIG. 15 shows the results obtained by actually measuring the polarization resistances R of two secondary batteries which differ from each other in respect to the quantity of liquid electrolyte for a period corresponding to the charge/discharge cycle repetition number NC of "0" to "200". In FIG. 15, a solid line curve represents the characteristic of a secondary battery having a smaller amount of liquid electrolyte while a single-dotted curve represents that of a secondary battery containing a standard amount of liquid electrolyte. The former is used for the purpose of comparison with the latter by intentionally making the polarization resistance R differ from that of the latter. As can be seen from the solid line curve shown in FIG. 15, the polarization resistance R assumes a greater value as the charge/discharge cycle repetition number NC increases.

In conjunction with the measurement of the polarization resistance R of the secondary battery during the charge/discharge process, there is known a method of varying the charge/discharge current I intentionally to thereby analyze the polarization resistance R by measuring the response of the terminal voltage V. In this conjunction, reference may be made, for example, to A. Fujishima et al's "DENKIKA-GAKU SOKUTEI HOU (ELECTROCHEMICAL MEASUREMENTS METHODS)", published by Gihoudou Publishing Company of Japan, p. 271. On the other hand, concerning the estimation of the open-circuit voltage Voc of the secondary battery, there may be mentioned a method of analyzing a curve representing a behavior of the terminal voltage V as a function of time during a period in which the charge/discharge is interrupted.

In the measurements of the polarization resistance R and the open-circuit voltage Voc, it is possible to suppress the lowering of the discharge capacity Cd due to the charge/discharge cycle repetition number NC by interposing a measurement mode for charging sufficiently the secondary battery. However, such interposition of the measurement mode means that the charge/discharge process of the secondary battery has to be interrupted even though it is only of a short duration.

As is apparent from the foregoing, in the conventional methods of measuring parameters of the secondary batteries, it is necessary to interpose a specific measuring mode during the charge/discharge process by interrupting it, which gives rise to a problem that difficulty is encountered in measuring the parameters required for the control for extending the life or effective charge/discharge cycle repeatable number NL of the secondary battery.

Furthermore, since the charge/discharge control method as well as the life prediction method based on the parameter measurements described above is poor in the capability of easily controlling the charge/discharge process and predicting or estimating the life of the secondary battery because of difficulty involved in measuring the parameters including the polarization resistance R and the open-circuit voltage Voc, presenting thus another problem that the life cycle number NL of the secondary battery can not effectively be elongated.

In addition, the conventional secondary battery charge/discharge control apparatus as well as the electric energy storage apparatus using the same equally suffers from a problem that it is difficult to easily controlling and effectively the charge/discharge process for increasing the life cycle number NL for thereby lengthening the use life of the secondary battery.

SUMMARY OF THE INVENTION

In the light of the state of the art described above, it is an object of the present invention to provide a parameter measuring method capable of measuring easily and accurately parameters which are intrinsic to various secondary batteries, respectively, and which vary as the number of the charge/discharge cycles increases, while suppressing lowering of the discharge capacity and evading interruption of the charge/discharge process due to interposition of the specific measurement mode.

Another object of the present invention is to provide a charge/discharge control method for secondary batteries, which method is capable of easily and effectively extending the use life of the secondary battery by preventing the overcharge and overdischarge by making use of parameters measured by the secondary battery parameter measurement methods mentioned previously.

Yet another object of the present invention is to provide a secondary battery life prediction method which is capable of easily estimating with high reliability the use life (i.e., effective charge/discharge cycle repeatable number) of the secondary battery by making use of the parameters (e.g. change of the polarization resistance, etc.) measured by the parameter measurement method mentioned previously.

A further object of the present invention is to provide a secondary battery charge/discharge control apparatus of a simple structure which is nevertheless imparted with a capability of extending the life of the secondary battery effectively and easily.

A still further object of the present invention is to provide an electric energy storage apparatus which allows electric energy or power to be stored therein by using the charge/discharge control apparatus mentioned above.

In view of the above and other objects which will become apparent as the description proceeds, there is provided according to an aspect of the present invention a parameter measuring method for measuring parameters of a secondary battery, which method includes the steps of measuring and storing a terminal voltage (V), a charge/discharge current (I) and a charge/discharge time (T) of the secondary battery in charge/discharge cycles thereof, arithmetically determining an integrated power (PS), an integrated charge quantity (QS) and an integrating time interval (TS) over a period extending from a start of a charge/discharge process to an end thereof in an immediately preceding cycle, determining a mean terminal voltage (Vm) including a mean terminal voltage (Vcm) in a charging process and a mean terminal voltage (Vdm) in a discharging process by dividing the integrated power (PS) by the integrated charge quantity (QS), determining a mean charge current (Icm) and a mean discharge current (Idm) by dividing the integrated charge quantity (QS) by the integrating time interval (TS), determining a polarization resistance (R) of the secondary battery on the basis of the mean terminal voltage (Vm) and the mean current (Im) by using a battery polarization resistance model, and determining an open-circuit voltage (Voc) of the secondary battery on the basis of the polarization resistance (R), the terminal voltage (V) measured currently and the charge/discharge current (I) measured currently.

With the secondary battery parameter measuring method described above, it is possible to measure easily and accurately the parameters which are inherent to individual secondary batteries and which may vary as the charge/discharge cycle progresses, without need for interposing any special measuring mode (thus without interrupting the charge/discharge process) while suppressing lowering of the discharge capacity Cd due to the charge/discharge cycle, presenting thus a significant advantage when compared with the conventional parameter measuring method while solving the problems thereof mentioned previously.

In a mode for carrying out the invention, the secondary battery may preferably be a lithium secondary battery.

By using as the secondary battery a lithium secondary battery which is excellent with respect to the charge/discharge characteristics, the lowering of the discharge capacity Cd due to the charge/discharge cycle can further be suppressed while ensuring easy and accurate measurement of the parameters inherent to the secondary battery which varies as the number of the charge/discharge cycles increases.

According to another aspect of the invention, there is provided a method of controlling charge/discharge of a secondary battery by using parameters measured as mentioned above. The battery charge/discharge control method may include the steps of controlling a predestinated charge/discharge current (Ii) which is to flow to/from the secondary battery on the basis of the polarization resistance (R) and the open-circuit voltage (Voc) and a predetermined upper limit open-circuit voltage (VcL) in the charging process, a predetermined lower limit open-circuit voltage (VdL) in the discharging process and a polarization limit voltage (dEL) such that a charge/discharge control voltage (VC) given as a product of a predestinated charge/discharge current (ii) and the polarization resistance (R) designed to flow to/from the secondary battery does not exceed the polarization limit voltage (dEL), determining a residual capacity (Cr) of the secondary battery on the basis of the open-circuit voltage (Voc), determining arithmetically a residual charge/discharge time (Tr) of the secondary battery on the basis of the residual capacity (Cr) and the predestinated charge/discharge current (Ii), and terminating the charge/discharge process of the secondary battery within the residual charge/discharge time (Tr) such that in the discharging process, the open-circuit voltage (Voc) does not drop below the lower limit open-circuit voltage (VdL) while in the charging process; the open-circuit voltage (Voc) does not exceed the upper limit open-circuit voltage (VcL).

With the arrangement of the charge/discharge control apparatus mentioned above, overcharge as well as overdischarge can easily and positively prevented, whereby the effective charge/discharge cycle repeatable number NL or life cycle of the secondary battery can be extended or lengthened significantly, to another great advantage.

According to yet another aspect of the invention, there is provided a method of predicting a life of the secondary battery by using a parameter measuring method, which method may include the steps of storing changes occurring in the polarization resistance (R) in every charge/discharge cycle of the secondary battery, performing on a charge/discharge cycle repetition number (NC) of the secondary battery a polynomial approximating extrapolation based on a method of least squares, and determining as an effective charge/discharge cycle repeatable number (NL) the charge/discharge cycle repetition number (NC) at a time point when the polarization resistance attains a preset limit polarization resistance (RL).

The secondary battery life prediction method mentioned above allows the life cycle number or the effective charge/discharge cycle repeatable number NL to be predicted easily and accurately on the basis of the parameters mentioned hereinbefore.

There is provided according to a further aspect of the invention a charge/discharge control apparatus for a secondary battery which apparatus includes a measuring means for measuring a terminal voltage (V), a charge/discharge current (I) and a charge/discharge time (T) of a secondary battery, a memory means for storing the terminal voltage (V), the charge/discharge current (I) and the charge/discharge time (T), a control unit for controlling a predestinated charge/discharge current (Ii) which is to flow to/from the secondary battery (12), and an arithmetic unit for arithmetically determining an open-circuit voltage (Voc), a polarization resistance (R) thereof, a life cycle number (NL), a residual charge/discharge time (Tr) and a charge/discharge control voltage (VC), respectively, of the secondary battery on the basis of the terminal voltage (V), the charge/discharge current (i), the predestinated charge/discharge current (Ii) and the charge/discharge time (T).

By virtue of the arrangement of the charge/discharge control apparatus described above, the charging which may cause the open-circuit voltage to exceed the upper limit open-circuit voltage VcL in the charging process or the discharging causing the former to decrease below the lower limit open-circuit voltage VdL in the discharging process, can positively be prevented, whereby the possibility of the overcharge and the overdischarge can be excluded. Besides, the charge/discharge exceeding the polarization limit voltage dEL as well as secondary reaction can satisfactorily be suppressed. In this manner, the life of the secondary battery can be easily and effectively extended.

In a further preferred mode for carrying out the invention, the secondary battery may be a lithium secondary battery.

By using a lithium secondary battery exhibiting excellent charge/discharge characteristics as the secondary battery, the life of the latter can remarkably be extended.

According to a still further aspect of the invention, there is provided an electric energy storing apparatus which may include a measuring means for measuring a terminal voltage (V), a charge/discharge current (I) and a charge/discharge time (T) of a secondary battery, a memory means for storing the terminal voltage (V), the charge/discharge current (i) and the charge/discharge time (T), a control unit for controlling a predestinated charge/discharge current (ii) which is to flow to/from the secondary battery (12), an arithmetic unit for arithmetically determining an open-circuit voltage (Voc), a polarization resistance (R) thereof, a life cycle number (NL), a residual charge/discharge time (Tr) and a charge/discharge control voltage (VC), respectively, of the secondary battery on the basis of the terminal voltage (V), the charge/discharge current (I), the predestinated charge/discharge current (Ii) and the charge/discharge time (T), and an A/D converter for converting an AC electric power into a DC power, for storing the DC power in the secondary battery.

With the structure mentioned above, there can be realized an electric energy storage apparatus which can enjoy similar advantages as those of the charge/discharge control apparatus mentioned previously.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which.

DESCRIPTION OF THE PREFERRED EMBODIMENTS

Figure 1:
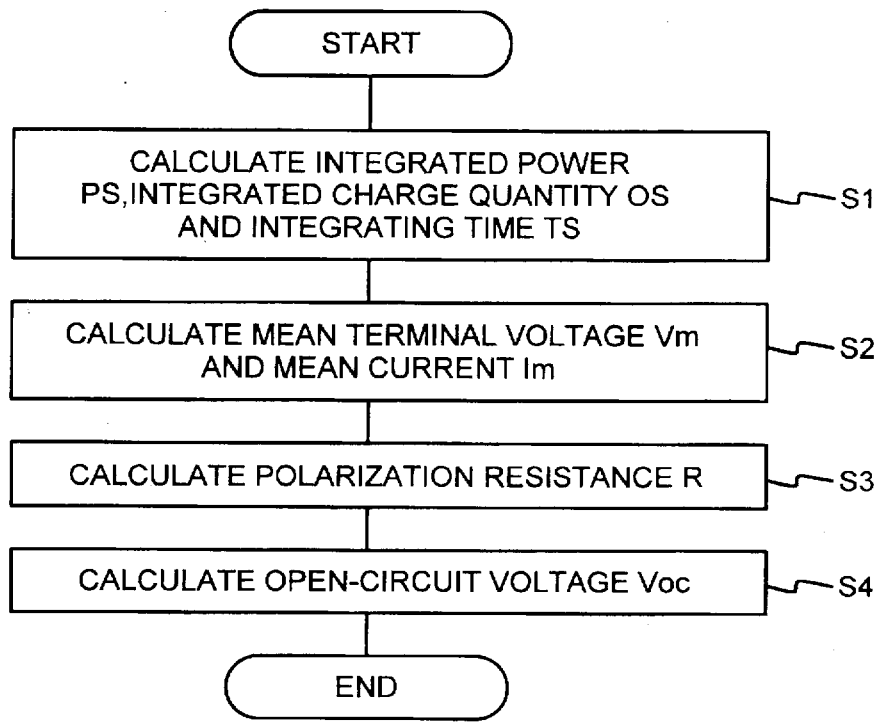
FIG. 1 is a flow chart for illustrating a secondary battery parameter measurement method according to a first embodiment of the present invention.

Now, the present invention will be described in detail in conjunction with what is presently considered as preferred or typical embodiments thereof by reference to the drawings. In the following description, like reference characters and symbols designate like or corresponding parts and quantities throughout the several views.

Embodiment 1

Figure 2:
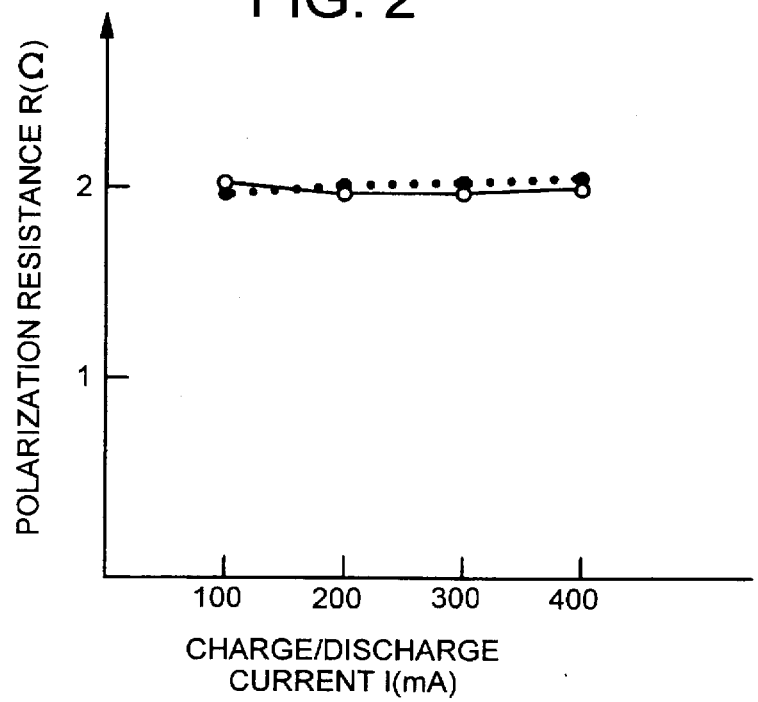
FIG. 2 is a characteristic diagram showing a relation between a polarization resistance and an open-circuit voltage measured as parameters by the method according to the first embodiment of the invention.
Figure 3:
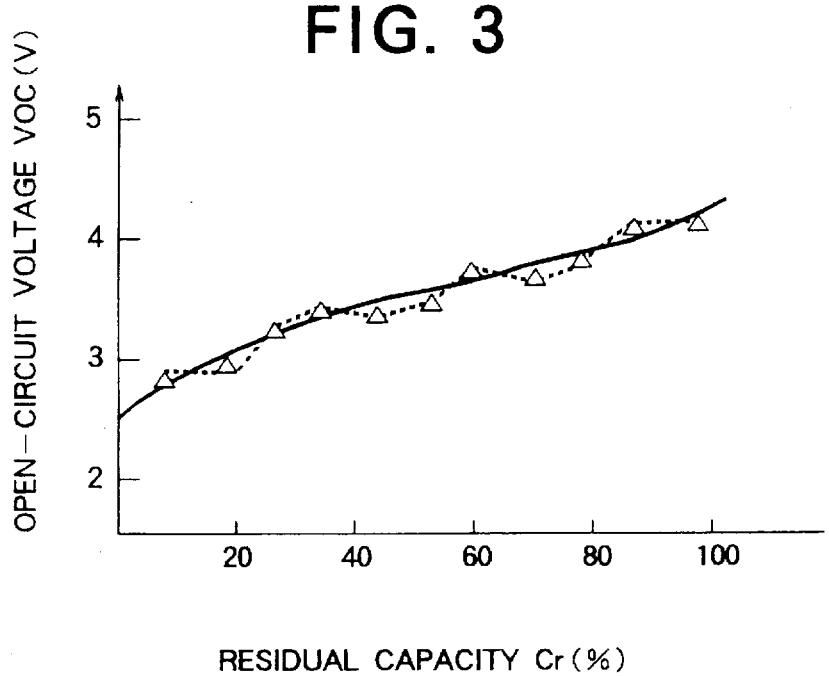
FIG. 3 is a characteristic diagram illustrating Voc-Cr obtained by plotting a residual capacity of a lithium secondary battery as a function of an open-circuit voltage as obtained by the parameter measuring method according to the first embodiment of the invention.

Now, a secondary battery parameter measuring method according to a first embodiment of the present invention will be described by reference to the drawings in which FIG. 1 is a flow chart for illustrating a secondary battery parameter measuring method according to the instant embodiment of the invention, FIG. 2 is a characteristic diagram showing a relation between a polarization resistance R and an open-circuit voltage Voc measured as the parameters by the method according to the instant embodiment, and FIG. 3 is a characteristic diagram illustrating graphically changes of the open-circuit voltage Voc as a function of a residual capacity Cr.

According to the concept of the present invention in the secondary battery parameter measuring method now under consideration, the parameter such as polarization resistance R which varies in dependence on the individual secondary batteries and which also varies as a function of the charge/discharge cycle repetition number NC can be measured without executing additionally any specific measurement mode during the charge/discharge process. To this end, it is required to measure and store a terminal voltage V, a charge/discharge current I and a charge/discharge time T of a secondary battery which is undergoing the charge/discharge process with the aid of a microcomputer system which incorporates an arithmetic unit for executing various arithmetic processings and a storage or memory for storing the results of the arithmetic processings as well as other data.

Referring to FIG. 1, a charge/discharge process is performed at least once for a secondary battery under measurement for arithmetically determining an integrated power PS, an integrated charge quantity QS and an integrating time interval TS from a start of the charge/discharge process to an end thereof (step S1 in FIG. 1).

Subsequently, a mean terminal voltage Vm is arithmetically determined by dividing the integrated power PS by the integrated charge quantity QS, while a mean current Im is determined by dividing the integrated charge quantity QS by the integrating time interval TS (step S2).

Incidentally, the mean terminal voltage Vm encompasses a mean terminal voltage Vcm in the charging process and a mean terminal voltage Vdm in the discharging process with the mean current Im encompassing a mean charge current Icm and a mean discharge current Idm.

Next, the polarization resistance R of the secondary battery is arithmetically determined by using a battery polarization resistance model on the basis of the mean terminal voltage Vcm in the charging process, the mean terminal voltage Vdm in the discharging process, the mean charge current Icm and the mean discharge current Idm (step S3).

The battery polarization resistance model can be given in the form of a mathematical expression defining a relation among the mean terminal voltage Vm, the mean current Im and the polarization resistance R. In a simplest battery polarization resistance model, the polarization resistance R can be regarded as constant. Thus, the mean terminal voltage Vm of the battery polarization resistance model may be given by the following expression (1):

$$Vm = Vocm + R \cdot Im \quad (1)$$

where the term "Vocm" represents a mean open-circuit voltage obtained by averaging the open-circuit voltage Voc. On the other hand, the polarization resistance R can be determined as a function of the parameters such as the types of the secondary batteries, structures thereof, ambient temperature of the environment in which the battery is opened, and the charge/discharge history (e.g. charge/discharge cycle repetition number NC). The function defining the polarization resistance R is invariable regardless of the type of the secondary battery and the structure thereof so far as the change in the polarization resistance R of one and the same secondary battery is of concern. Further, the function defining the polarization resistance R may be regarded to be constant with respect to the ambient temperature except for the case where the change of the ambient temperature is exceptional. Accordingly, on the conditions mentioned above, the polarization resistance R can be regarded to change as a function only of the charge/discharge cycle repetition number NC.

Figure 12:
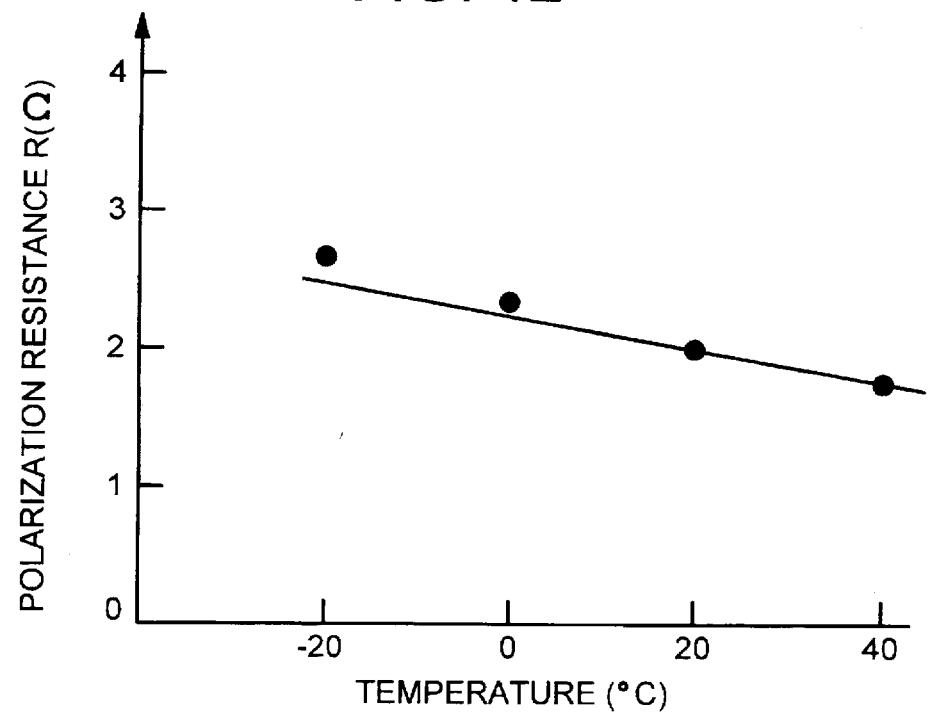
FIG. 12 is a characteristic diagram for graphically illustrating actually measured changes in a polarization resistance of a lithium secondary battery of lithium ion type as a function of variation.

As pointed out hereinbefore, in the case of the lithium secondary battery, the polarization resistance R may be regarded to be constant for practical applications so long as the variation of the ambient temperature lies within the range of ±5° C. (refer to FIG. 12). Accordingly, use of the simple secondary battery polarization resistance model given by the aforementioned expression (1) is usually accompanied by no problem.

From the expression (1) mentioned above, the mean terminal voltage Vcm in the charging process and the mean terminal voltage Vdm in the discharging process, respectively, can be determined as follows:

$$Vcm = Vocm + R \cdot Icm \quad (1a)$$

$$Vdm = Vocm + R \cdot Idm \quad (1b)$$

In the above expressions (1a) and (1b), the mean charge current Icm and the mean discharge current Idm flows in the opposite directions, respectively, and the mean discharge current Idm assumes a value of negative or minus sign. Accordingly, by using the absolute values of the mean charge current Icm and the mean discharge current Idm, respectively, the expression (1b) can be rewritten as follows:

$$Vdm = Vocm - R \cdot Idm \quad (1c)$$

In the expressions (1a) and (1c), the mean open-circuit voltages Vocm in the charging and discharging processes, respectively, can be regarded to be equal to each other, wherein the mean terminal voltage Vcm in the charging process is usually higher than the mean open-circuit voltage Vocm while the mean terminal voltage Vdm in the discharging process is ordinarily lower than the mean open-circuit voltage Vocm.

Accordingly, by subtracting the expressions (1c) from the expression (1a), the polarization resistance R can be given by the following expression (2):

$$R = (Vcm - Vdm)/(Icm + Idm) \quad (2)$$

The value of the polarization resistance R obtained from the expression (2) is stored in the memory to be used in the measurement of the open-circuit voltage Voc in the succeeding charge/discharge cycle.

Namely, by using the polarization resistance R as stored and the terminal voltage V and the charge/discharge current I of the secondary battery measured currently, the open-circuit voltage Voc can arithmetically be determined by modifying the expression (1) as follows:

$$Voc = V \pm R \cdot I \quad (3)$$

In the above expression, the addition indicated by the plus sign "+" is performed for determining the open-circuit voltage Voc in the charging process, whereas substraction indicated by "−" is performed for determining the open-circuit voltage Voc in the discharging process.

In this way, the polarization resistance R and the open-circuit voltages Voc, the typical parameters of the secondary battery, can easily and accurately be determined without resorting to interposition Of any independent measurement mode, differing from the conventional methods described hereinbefore.

The inventors of the present application experimentally conducted constant-current charge/discharge cycles by using a lithium ion type lithium secondary battery (of 2/3A size manufactured by the assignee of the present application) as the secondary battery to be tested and a charge/discharge testing apparatus commercially available under the trade name "HJ201B" from Hokuto Denkou Company of Japan. The results of this experiment will be elucidated below.

The experiments were conducted on the following standard conditions. Namely, the upper limit open-circuit voltage VcL in the charging process is 4.2 V (volts), the lower limit open-circuit voltage VdL in the discharging process is 2.5 V, a predestinated charge current Ici of a predestinated charge/discharge current Ii is 100 mA (milliamperes), and a predestinated discharge current Idi is 200 mA.

At first, the terminal voltage V and the charge/discharge currents I of the lithium secondary battery during the charge/discharge processes were measured periodically at a time interval of 30 seconds by using a data logger commercially available under the trade name "TR2731" from Advantest Company and recorded on a magnetic disk. On the basis of the data collected in this way, the integrated power PS, the integrated charge quantity QS and the integrating time interval TS were arithmetically determined by using a personal computer commercially available under the trade name "PC-9801VM11" from NEC Corporation of Japan.

Subsequently, the mean terminal voltage Vm was calculated by dividing the integrated power PS by the integrated charge quantity QS, and the mean current Im was calculated by dividing the integrated charge quantity QS by the integrating time TS. On the basis of the mean terminal voltage Vcm in the charging process, the mean terminal voltage Vdm in the discharging process, the mean charge current Icm and the mean discharge current Idm, the polarization resistance R was determined in accordance with the expression (2) mentioned previously, while the open-circuit voltage Voc was determined in accordance with the expression (3).

From the foregoing, it will now be understood how the parameter measuring method according to the instant embodiment of the invention can be carried out.

With a view to verifying the effectiveness of the parameter measuring method according to the first embodiment of the present invention, the conventional parameter measuring method was experimentally carried out by using the aforementioned lithium ion type lithium secondary battery. In this case, the charge/discharge cycle test was performed for measuring the open-circuit voltage Voc and the polarization resistance R on the same test conditions as mentioned previously except for interposition of a pause or interruption period of ten minutes upon every lapse of ten minutes in the course of the charge/discharge process. Hereinafter, this conventional parameter measuring method will be referred to as the interruption method.

The open-circuit voltage Voc can be determined through linear approximation by plotting the change of the terminal voltage V recorded during the interruption time period as a reciprocal of the time. More specifically, the voltage at the zero point on the time reciprocal axis is determined as the open-circuit voltage Voc. The polarization resistance R can then be determined by dividing a difference between the open-circuit voltage Voc as obtained and the terminal voltage V measured immediately preceding to the interruption by the charge/discharge current I.

FIG. 2 shows R-versus-I characteristics of the lithium secondary battery obtained by plotting the polarization resistance R as a function of the charge/discharge current I in accordance with the parameter measuring method according to the first embodiment of the invention and the conventional interruption method, respectively, wherein a solid-line curve represents the characteristic according to the invention with a broken-line curve representing that of the conventional method.

FIG. 3 shows Voc-versus-Cr characteristics obtained by plotting the residual capacity Cr of the lithium secondary battery as a function of the open-circuit voltage Voc in accordance with the parameter measuring method of the invention in the instant embodiment and the conventional interruption method in which a solid-line curve represents the characteristic of the lithium secondary battery measured according to the instant embodiment of the invention with a broken-line curve representing the corresponding characteristic measured by the conventional interruption method.

As can be seen from FIGS. 2 and 3, the results of the measurements according to the instant embodiment of the invention (solid-line curve) and the conventional interruption method coincide well with each other in respect to both the polarization resistance R and the open-circuit voltage Voc, which in turn means that the polarization resistance R and the open-circuit voltage Voc can be obtained accurately and easily according to the teachings of the invention in the instant embodiment without interposing the independent measuring mode as in the case of the conventional method.

Although the foregoing description has been made on the assumption that the secondary battery under test is a lithium secondary battery having excellent charge/discharge characteristics, it goes without saying that similar advantageous effects can equally be ensured for other secondary batteries.

Embodiment 2

The first embodiment of the invention described above is directed to the determination of the parameters of the secondary battery, such as the polarization resistance R and the open-circuit voltage Voc. With the second embodiment of the invention, it is contemplated to realize a charge/discharge control method of the secondary battery for extending the life cycle number or the effective charge/discharge cycle repeatable number NL defined previously on the basis of the polarization resistance R and the open-circuit voltage Voc measured by the parameter measuring method according to the first embodiment together with an upper limit open-circuit voltage VcL in the charging process, a lower limit open-circuit voltage VdL in the discharging process and a polarization limit voltage dEL whose values are previously set.

Now, description will be directed to the secondary battery control method according to the second embodiment of the invention which makes it possible to extend or increase the life of the secondary battery by using the upper limit open-circuit voltage VcL in the charging process, the lower limit open-circuit voltage VdL in the discharging process, as well as the polarization resistance R and the open-circuit voltage Voc determined according to the method described above in conjunction with the first embodiment.

According to the concept of the invention in the instant embodiment, the predestinated charge/discharge current Ii is so controlled that the charge/discharge control voltage VC given by a product of the predestinated charge/discharge current Ii and the polarization resistance R does not exceed the polarization limit voltage dEL.

Parenthetically, the charge/discharge control voltage VC is an overvoltage which can be predicted on the basis of the predestinated charge/discharge current Ii. When the prediction is correct, the charge/discharge control voltage VC coincides with the overvoltage which is represented by a difference between the open-circuit voltage Voc and the terminal voltage V. On the other hand, the polarization limit voltage dEL represents an upper limit voltage regardless of whether the charging process or the discharging process is of concern, because the polarization voltage Vp is given as an absolute value of a difference between the open-circuit voltage Voc and the terminal voltage V.

Further, the charge/discharge of the secondary battery is terminated within a charge/discharge time T which is so determined by using the predestinated charge/discharge current Ii and the residual capacity Cr determined on the basis of the open-circuit voltage Voc that the open-circuit voltage Voc is prevented from lowering below the lower limit open-circuit voltage VdL during the discharge process, while during the charging process, the open-circuit voltage Voc does not increase beyond the upper limit open-circuit voltage VcL.

Figure 4:
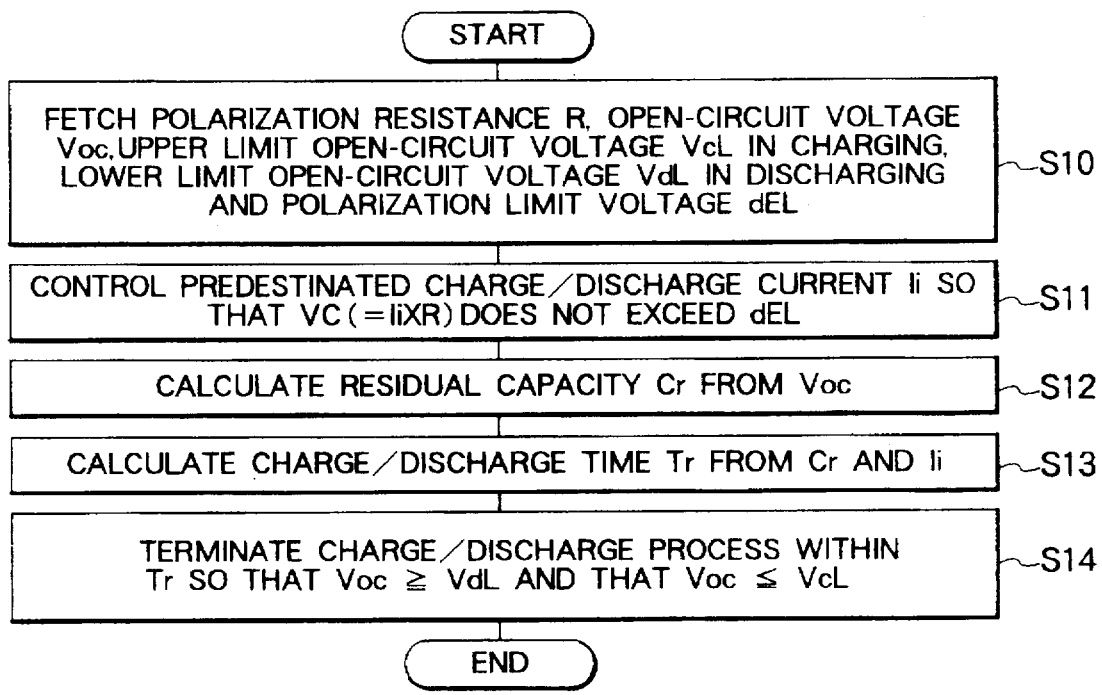
FIG. 4 is a flow chart for illustrating a charge/discharge control method according to a second embodiment of the invention.

FIG. 4 is a flow chart for illustrating the charge/discharge control method according to the second embodiment of the invention.

Referring to the figure, the polarization resistance R and the open-circuit voltage Voc measured by the method described above as well as the upper limit open-circuit voltage VcL in the charging process, the lower limit open-circuit voltage VdL in the discharging process set previously are fetched in a step S10, which is then followed by a step S11 where the predestinated charge/discharge current Ii is so controlled that the charge/discharge control voltage VC (=Ii·R) does not exceed the polarization limit voltage dEL.

The preset values of the upper limit open-circuit voltage VcL in the charging process, the lower limit open-circuit voltage VdL in the discharging process and the polarization limit voltage dEL are experimentally determined in dependence on the types of the secondary batteries. By way of example, in the case of the lithium secondary battery of lithium ion type, the values mentioned above are:

$$VcL = 4.2 \text{ V}$$
$$VdL = 2.5 \text{ V}$$
$$dEL = 0.5 \text{ V}$$

At this juncture, it should however be mentioned that the preset values as mentioned above are not always the same intrinsically for all the lithium secondary batteries of the lithium ion type because they may differ in respect to the material as used in manufacturing. In actually, a variety of materials or substances have heretofore been proposed for use in the lithium secondary batteries of the lithium ion type.

Next, the residual capacity Cr is calculated on the basis of the open-circuit voltage Voc in a step S12, whereupon the residual charge/discharge time Tr is calculated from the residual capacity Cr and the predestinated charge/discharge current Ii in a step S13.

Figure 13:
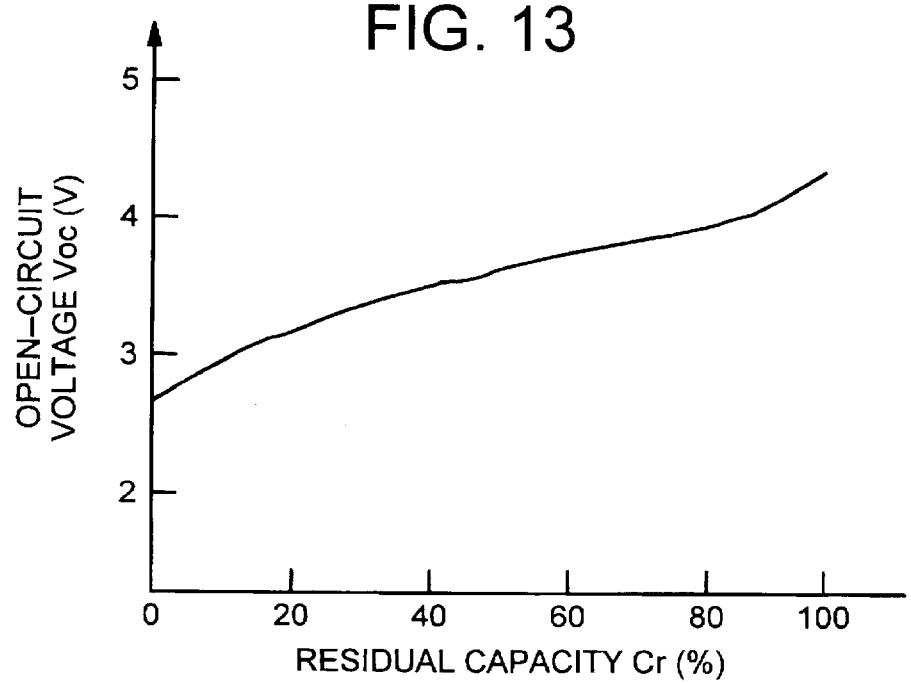
FIG. 13 is a characteristic diagram illustrating graphically a relation between a residual capacity and an open-circuit voltage of a lithium secondary battery.
Figure 14:
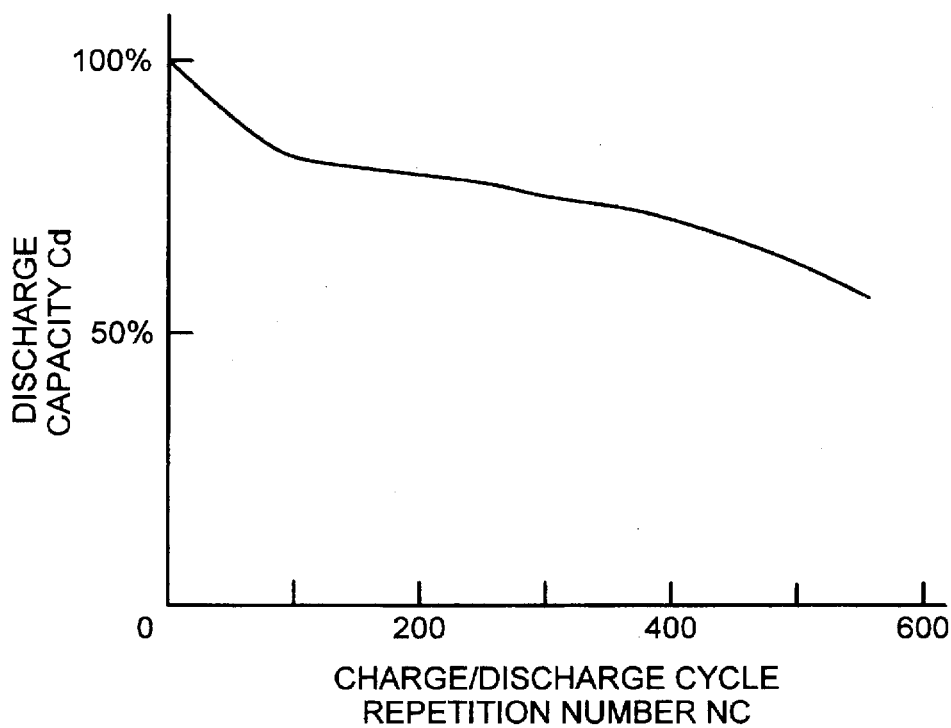
FIG. 14 is a characteristic diagram illustrating a relation between a charge/discharge repetition number and a discharge capacity of a secondary battery.
Figure 15:
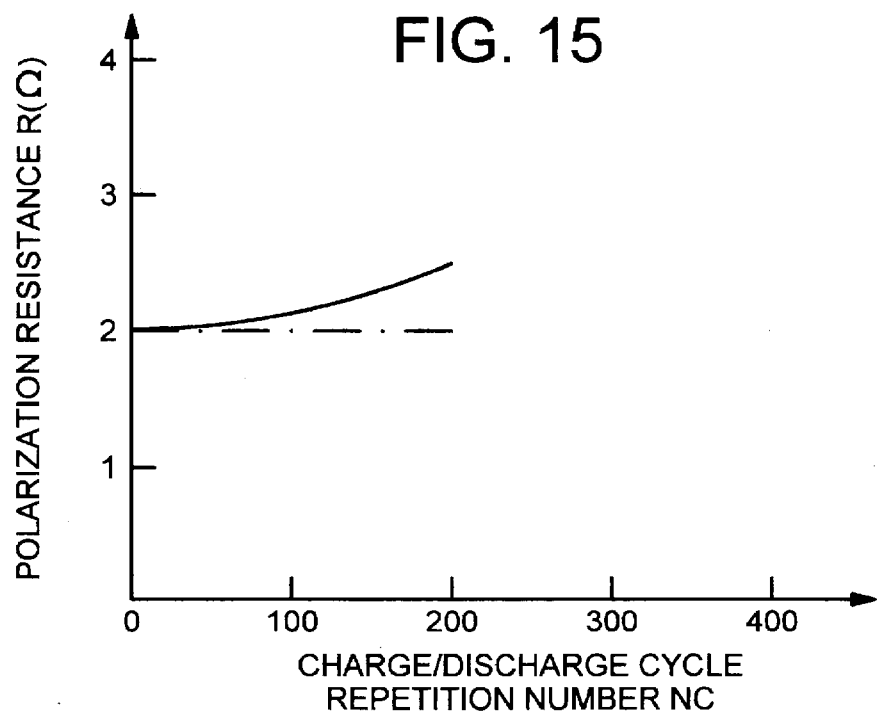
FIG. 15 is a characteristic diagram for graphically illustrating variation of the polarization resistance as a function of a charge/discharge cycle repetition number.

As described hereinbefore by reference to FIGS. 13 and 14, the relation between the open-circuit voltage Voc and the residual capacity Cr is also experimentally determined. The absolute capacity of the secondary battery assumes different values at the beginning and at the end of the charge/discharge cycle even when the open-circuit voltage Voc remains at a same level.

Such being the circumstances, it is necessary to correct the relation between the absolute capacity and the relative capacity by storing the open-circuit voltage Vocs at the start of the charging process and the open-circuit voltage Voce at the end of the charging process in the immediately preceding charge/discharge cycle.

By way of example, let's represent by s (%) the relative capacity corresponding to the open-circuit voltage Vocs at the start of the charging process and by e (%) the relative capacity corresponding to the open-circuit voltage Voce at the end of the charging process, both being determined from the relation shown in FIG. 13. Further, representing by Cc the charging capacity at that time and by Ca the absolute capacity corresponding to the relative capacity e of 100%, then the absolute capacity Ca can be determined in accordance with the following expression:

$$Ca=Cc\times 100/(e-s) \quad (4)$$

The above expression (4) applies equally valid in the discharging process of the secondary battery. Namely, the absolute capacity Ca in the discharging process can be determined by replacing the charge capacity Cc by the discharge capacity Cd in the expression (4).

Parenthetically, the residual charge/discharge time Tr calculated in the step S13 can be expressed by using the predestinated charge/discharge current Ii and the residual capacity Cr determined from the open-circuit voltage Voc as following:

$$Tr=Cr/Ii \quad (5)$$

Finally, in a step S14, the charge/discharge process of the secondary battery is ended within the residual charge/discharge time Tr determined so that the open-circuit voltage Voc does not lower below the lower limit open-circuit voltage VdL during the discharging process and that the open-circuit voltage Voc does not exceed the upper limit open-circuit voltage VcL during the charging process.

Figure 5:
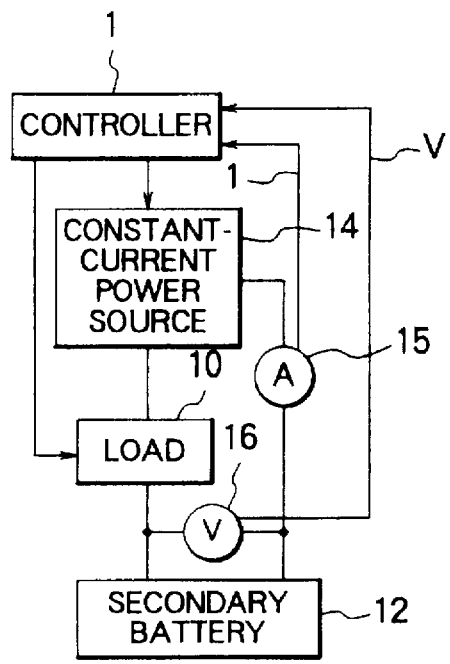
FIG. 5 is a block diagram showing an exemplary structure of a charge/discharge control apparatus implemented so as to operate on the basis of an open-circuit voltage and a polarization voltage used in the control method according to the second embodiment of the invention.
Figure 6:
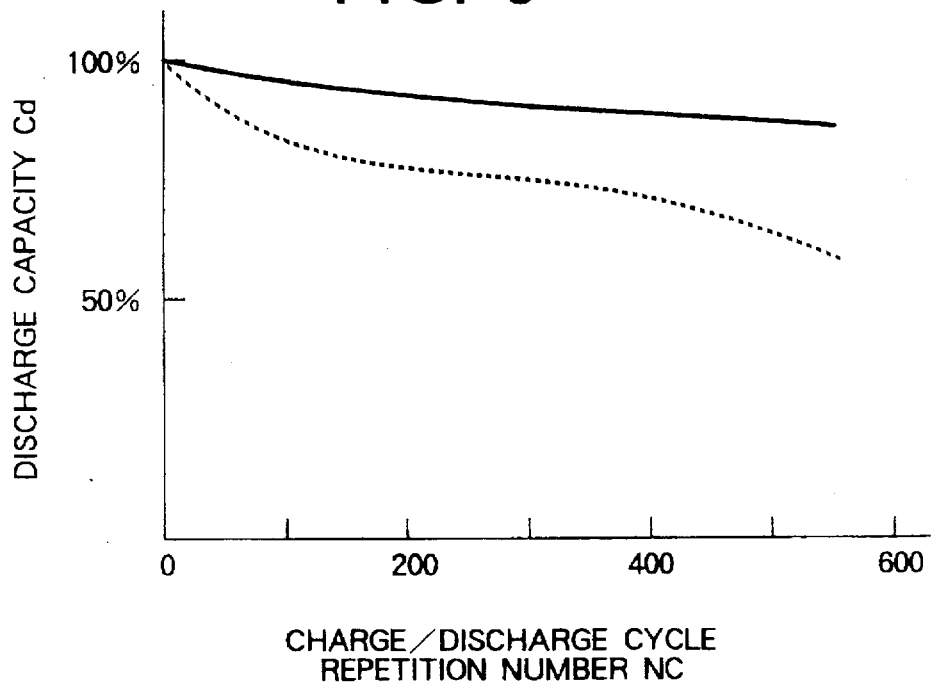
FIG. 6 illustrates graphically a characteristic relation between changes in a discharge capacity and a charge/discharge cycle repetition number as determined in accordance with the second embodiment of the invention.

Next, a concrete example of the instant embodiment of the invention will be described by reference to a block diagram of FIG. 5 and a characteristic diagram of FIG. 6, in which FIG. 5 shows a charge/discharge test apparatus and FIG. 6 illustrates graphically a relation between the discharge capacity Cd and the charge/discharge cycle repetition number NC.

First referring to FIG. 5, the charge/discharge test apparatus is comprised of a controller 1 including a central processing unit or CPU, a memory and other elements, a load 10 to which an electric power is supplied under the control of the controller 1, a secondary battery 12 for supplying an electric power to the load 10, a constant-current power source 14 for supplying a constant current to the load 10 and the secondary battery 12 under the control of the controller 1, an ampere meter 15 inserted between the secondary battery 12 and the constant-current power source 14 for detecting the charge/discharge current I and a voltmeter 16 connected between both electrode terminals of the secondary battery 12. The charge/discharge current I and the terminal voltage V of the secondary battery 12 as detected by the ampere meter 15 and the voltmeter 16, respectively, are inputted to the controller 1 as data.

The secondary battery 12 which underwent the test was a lithium secondary battery of lithium ion type (manufactured by the assignee of the present application). Further, as the constant current source constituting the charge/discharge testing apparatus together with the controller 1, a constant current source commercially available under the trade name "PAX16-20" from Kikusui Electronic Company of Japan was used. Additionally, as the load 10, an electric consumption device commercially available under the trade name "PLZ-153W" from the above company was used, while as the controller 1 for controlling the charge/discharge process, a personal computer commercially available under the trade name "PC-9801DA" from NEC Corporation was employed.

As in the case of the first embodiment of the invention, the upper limit open-circuit voltage VcL in the charging process was set at 4.2 volts, the lower limit open-circuit voltage VdL in the discharging process was set at 2.5 volts, the predestinated charge current Ici was set at 100 mA and the predestinated discharge current Idi was set at 200 mA. On these standard conditions, the charge/discharge cycle test was conducted by adopting the charge/discharge control method described hereinbefore by reference to FIG. 4.

As the result of the charge/discharge test, there can be obtained such characteristic of the discharge current Cd of the secondary battery 12 as indicated by a solid-line curve shown in FIG. 6 which illustrates an experimentally obtained relation between the discharge current Cd and the charge/discharge cycle repetition number NC. It can be seen from FIG. 6 that the discharge current Cd of the secondary battery 12 is substantially constant independent of the charge/discharge cycle repetition number NC in the case of the charge/discharge control method according to the instant embodiment of the invention.

On the other hand, in the case of the discharge current Cd method known heretofore, the discharge current Cd in the charge/discharge cycle varies as a function of the charge/discharge cycle repetition number NC in such a manner as indicated by a phantom-line characteristic curve which was obtained on the aforementioned standard conditions (i.e., the upper limit open-circuit voltage VcL in the charging process =4.2 volts, the lower limit open-circuit voltage VdL in the discharging process=2.5 volts, the predestinated charge current Ici=100 mA and the predestinated discharge current Idi=200 mA.

As can be seen from the characteristic diagram of FIG. 6, the discharge current Cd in the charge/discharge cycle becomes significantly low as the charge/discharge cycle repetition number NC increases in the case of the conventional control method (see the broken-line curve). By contrast, the discharge current Cd in a charge/discharge cycle can maintain a high capacity over an extended period because the secondary battery can be charged sufficiently without being accompanied with overcharge in the case of the charge/discharge control method according to the instant embodiment of the invention.

Embodiment 3

In the case of the second embodiment of the invention, it is aimed to extend or lengthen the life of the secondary battery 12 by controlling it by using the parameters measured by the method according to the first embodiment of the invention. However, it is equally possible to estimate the life of the secondary battery 12 by using these measured parameters. More specifically, by storing the changes in the polarization resistance R measured in every charge/discharge cycle and performing on the charge/discharge cycle repetition number NC a polynomial approximating extrapolation based on a method of least squares, it is possible to determine or estimate the life cycle number (life) or the charge/discharge cycle repetition number NC of the battery at which the limit polarization resistance RL set previously is attained, as the effective charge/discharge cycle repeatable number NL expected at that time point.

Figure 7:
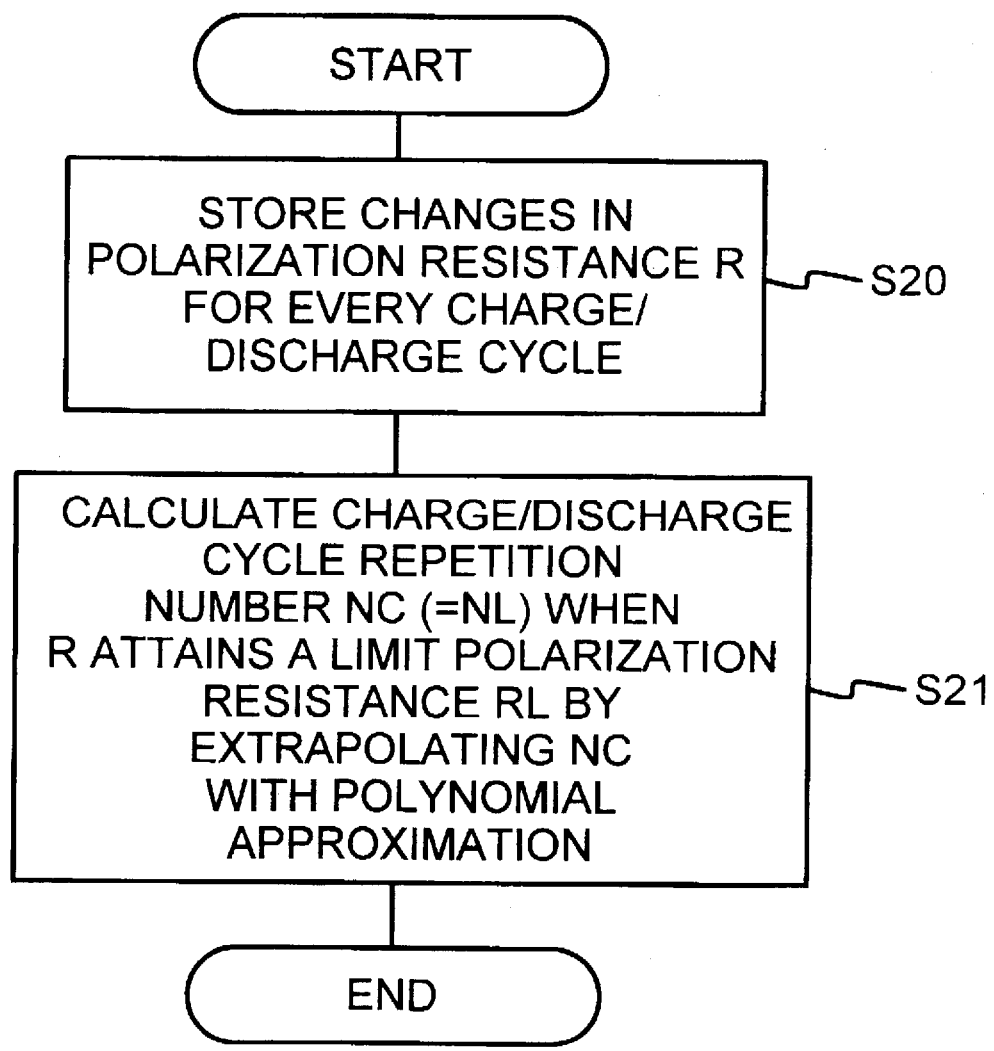
FIG. 7 is a flow chart illustrating a battery life estimating method according to a third embodiment of the present invention.

In the following, a secondary battery life estimating method effected by utilizing the parameter measuring method described hereinbefore in conjunction with the first embodiment will be elucidated by reference to a flow chart shown in FIG. 7.

Referring to this figure, in a step S20, the polarization resistance R calculated in the step S3 mentioned previously (see FIG. 1) is fetched for storing the changes of the polarization resistance R in every charge/discharge cycle of the secondary battery 12.

Subsequently, a polynomial approximating extrapolation based on a method of least squares is performed on the charge/discharge cycle repetition number NC of the secondary battery 12 to thereby determine as the effective charge/discharge cycle repeatable number (life or life cycle number) NL of the secondary battery 12 as expected the charge/discharge cycle repetition number NC at a time point when the polarization resistance R has attained the limit polarization resistance RL set previously in a step S21.

The preset value of the limit polarization resistance RL may change in dependence on the definition of the effective charge/discharge cycle repeatable number NL and the expected mean current Im. In this content, let's define the life of the secondary battery as a life span during which the initial capacity (100%) of the secondary battery progressively falls to 70% thereof. More specifically, assuming that the open-circuit voltage Voc is set at 4.0 volts, the mean current Im is set at 200 mA, the upper limit open-circuit voltage VcL in the charging process is set at 4.2 volts and that the polarization limit voltage dEL is set at 0.5 volt when the relative residual capacity Cr is 70%, then the limit polarization resistance RL can be determined as follows:

$$RL = (4.2 - 4.0 + 0.5)/0.2$$
$$= 3.5 [\Omega]$$

The inventors of the present application have conducted an experiment concerning the secondary battery life estimation according to the teaching of the invention in the instant embodiment. This will be elucidated by reference to characteristic diagrams of FIGS. 8 and 9.

In the case of this experiment, two different lithium secondary batteries of lithium ion type (each 2/3A size, manufactured by the assignee of the present application) were selected as the secondary batteries 12 to be tested. A charge/discharge testing apparatus commercially available under the trade name "HJ201B" from Hokuto Denkou Company of Japan was used. The test was carried out by executing the constant-current charge/discharge cycles as in the case of the experiment described previously in conjunction with the first embodiment of the invention.

On the standard conditions that the upper limit open-circuit voltage VcL in the charging process is 4.2 volts, the lower limit open-circuit voltage VdL in the discharging process is 2.5 volts, the predestinated charge current Ici is 100 mA and that the predestinated discharge current Idi is 200 mA, the charge/discharge process was repeated until the discharge current Cd has attained a value corresponding to 70% of the design capacity (100%).

At first, the terminal voltage V and the charge/discharge currents I of the secondary battery 12 were measured during the charge/discharge processes periodically at a time interval of 30 seconds by using a data logger "TR2731" manufactured by Advantest Company, the results of the measurements being recorded on a magnetic disk.

Subsequently, by using a personal computer "PC-9801VM11" manufactured by NEC Corporation, the integrated power PS, the integrated charge quantity QS and the integrating time interval TS were calculated for every charge/discharge cycle, whereon the mean terminal voltage Vm was determined by dividing the integrated power PS by the integrated charge quantity QS, while determining the mean current Im by dividing the integrated charge quantity QS by the integrating time interval TS. Finally, on the basis of the mean terminal voltage Vm and the mean current Im, the polarization resistance R and the open-circuit voltage Voc were determined in accordance with the aforementioned expressions (2) and (3), respectively.

Substantially, on the basis of the change in the polarization resistance R which occurs as a function of the charge/discharge cycle repetition number NC, the charge/discharge cycle repetition number NC (=effective charge/discharge cycle repeatable number NL) at the time point when the polarization resistance R attained the limit polarization resistance RL was determined by the polynomial approximating extrapolation based on a method of least squares.

Figure 8:
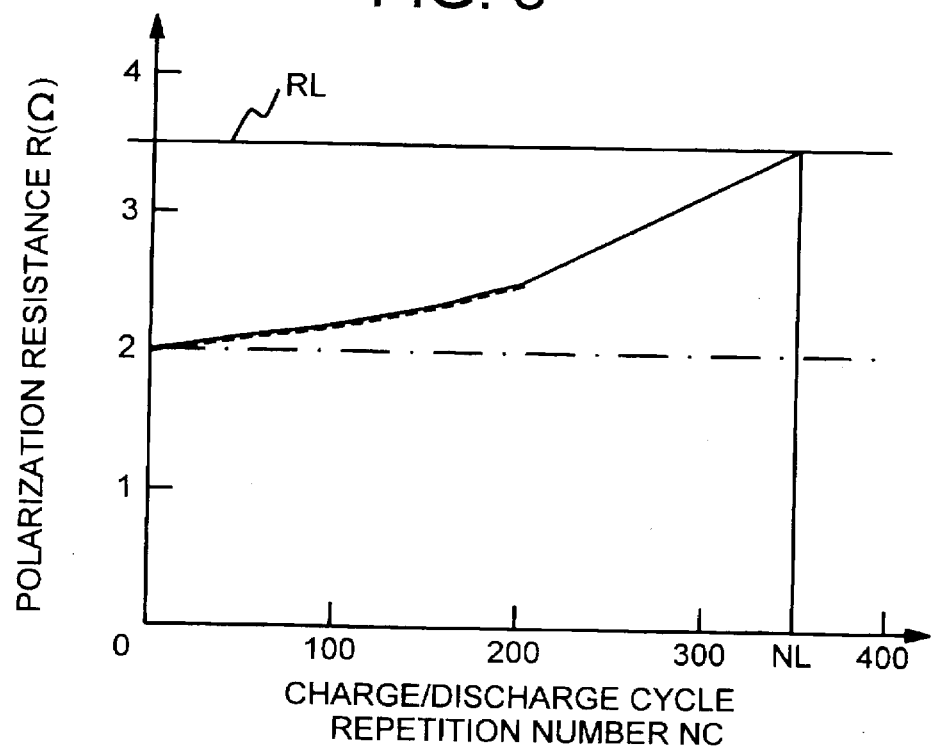
FIG. 8 is a characteristic diagram for graphically illustrating a relation between change in a polarization resistance of secondary batteries and a life cycle number thereof.

FIG. 8 is a characteristic diagram for graphically illustrating the change in the polarization resistance R of the two secondary batteries 12 which differ from each other in respect to the amount of the liquid electrolyte in every charge/discharge cycle. In the figure, the limit polarization resistance RL is set at 3.5Ω or so. A single-dotted curve represents the characteristic when the quantity of the liquid electrolyte is standard, while a broken-line curve and a solid-line curve represent the characteristics when the amount of liquid electrolyte is small, wherein the broken-line curve represents the results actually obtained by measuring over a period corresponding to the charge/discharge cycle repetition number NC ranging from 0 (zero) to 200, while the solid-line curve is obtained after the polynomial approximating extrapolation based on a method of least squares for the charge/discharge cycle repetition number NC ranging from 0 (zero) to 400. The polynomial approximation based on the method of least squares executed in the step S21 in FIG. 7 can be given by a function f of degree n indicating a relation between the polarization resistance R and the charge/discharge cycle repetition number NC as follows:

$$R = f(NC) \tag{6}$$
$$= A0 + A1 \cdot NC + A2 \cdot NC^2 +$$
$$A3 \cdot NC^3 + A4 \cdot NC^4 + \ldots + An \cdot NC^n$$

where values of variables A0 to An are so determined that a square value of a deviation or difference between the characteristic (solid-line curve in FIG. 8) of the polarization resistance R predicted from the charge/discharge cycle repetition number NC and the characteristic of the polarization resistance R measured actually becomes minimum. Further, the degree n of the polynomial (6) should ideally be set at a value smaller by one than the number of the data obtained by the actual measurement. However, for the practical purpose, the degree n equal to "5" at the greatest will be sufficient.

As can be seen from the characteristic diagram of FIG. 8, in the case of the secondary battery 12 containing a smaller amount of liquid electrolyte (see the solid-line characteristic curve), it is estimated that the polarization resistance R will be reached at or in the vicinity of the charge/discharge cycle repetition number NC=350 (which equal the effective charge/discharge cycle repeatable number NL).

In this manner, the life cycle number or the effective charge/discharge cycle repeatable number NL of the secondary battery 12 can be predicted through the approximation based on the polynomial (6).

Figure 9:
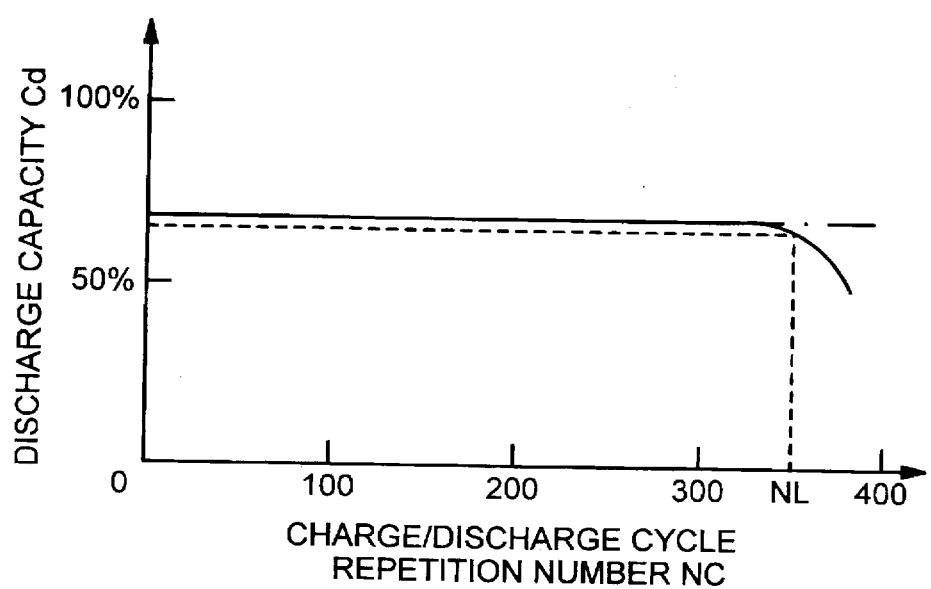
FIG. 9 is a characteristic diagram illustrating a relation between change in a discharge capacity of secondary batteries and charge/discharge cycle repetition number employed in the life predicting method according to the third embodiment of the invention.

FIG. 9 is a characteristic diagram illustrating the change in the discharge capacity Cd as a function of the charge/discharge cycle repetition number NC ranging from 0 (zero) to 400, wherein a solid-line curve represents the characteristic for the secondary battery of a small amount of liquid electrolyte, while a single-dotted line represents the characteristic for the secondary battery containing a standard amount of liquid electrolyte.

As can be seen from FIG. 9, in the case of the secondary battery 12 containing a small amount of liquid electrolyte (solid-line curve), the discharge capacity Cd which corresponds to 70% of the design capacity can no more be sustained when the charge/discharge cycle repetition number NC reaches or exceeds a number of about 350, resulting in lowering of the capacity in reality.

Embodiment 4

In conjunction with the first, second and third embodiments of the present invention, description has been made of the secondary battery parameter measuring method, the secondary battery charge/discharge control method and the life predicting method using the parameter measuring method, respectively. Next, description will turn to a charge/discharge control apparatus for carrying out these methods.

Fourth Embodiment

Figure 10:
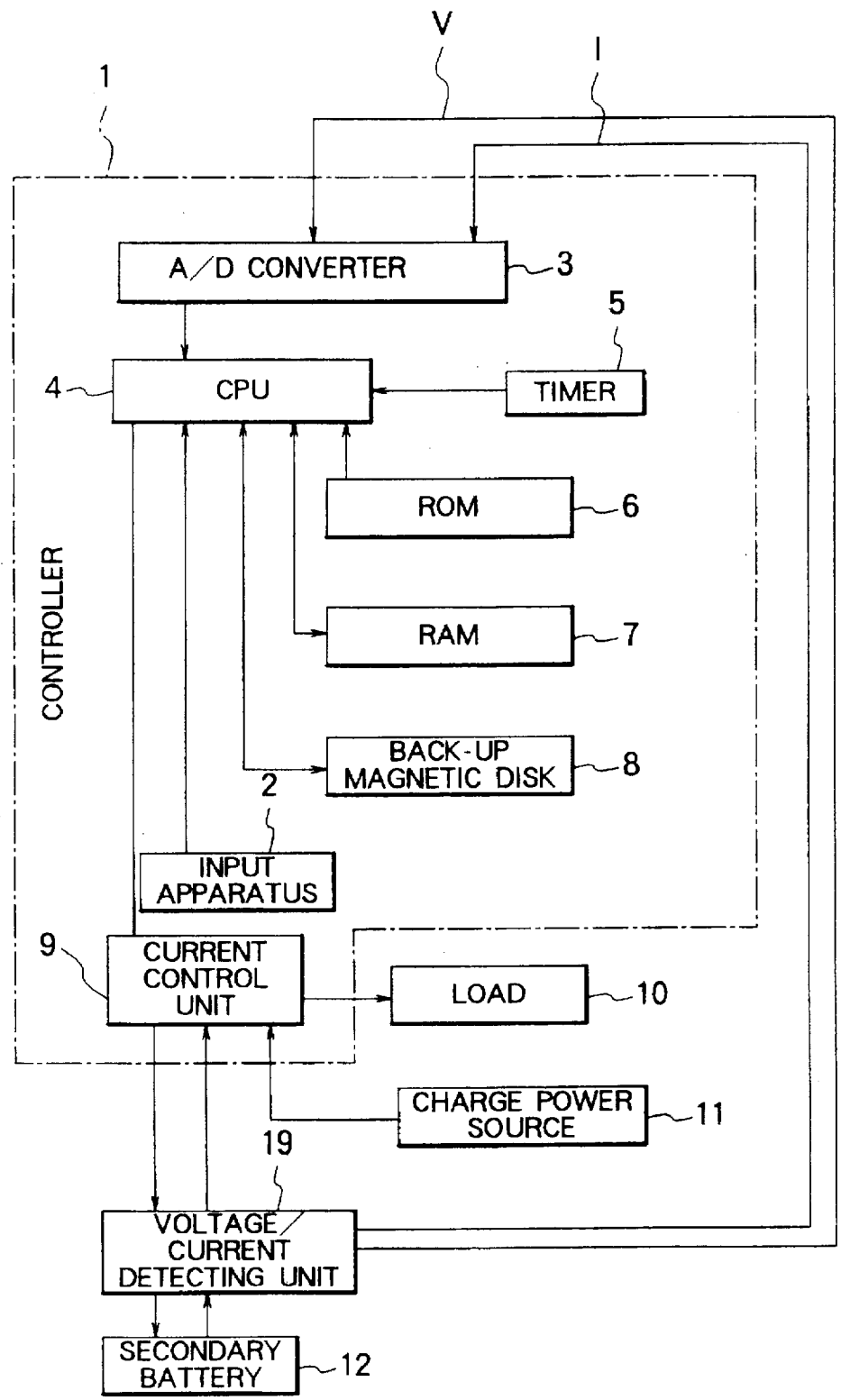
FIG. 10 is a block diagram showing a structure of a charge/discharge control apparatus according to a fourth embodiment of the invention.

FIG. 10 is a block diagram showing a structure of a charge/discharge control apparatus according to a fourth embodiment of the invention. In the figure, reference numerals 1, 10 and 12 denote parts which are the same as or equivalent to those designated by the same numerals in FIG. 5 (second embodiment).

Referring to FIG. 5, the controller 1 is comprised of an input apparatus 2 including a keyboard or like devices, an analogue-to-digital or A/D converter 3 for fetching the measurement data concerning the secondary battery 12 such as the terminal voltage V and the charge/discharge current I to thereby convert them to respective digital signals, a central processing unit or CPU 4 to which various signals are supplied from the input apparatus 2 and the A/D converter 3, a timer 5 for supplying chronometric or time data to the CPU 4, a read-only memory or ROM 6 for storing programs and other information required for operating the CPU 4, a random-access memory or RAM 7 for storing data for or resulting from arithmetic operations executed by the CPU 4, a back-up magnetic disk 8 serving as an external storage means for the CPU 4, and a current control unit 9 connected to the CPU 4 for controlling a current (i.e., a predestinated charge/discharge current Ii) for the load 10 under the control of the CPU 4.

The CPU 4 includes a measuring means for measuring the terminal voltage V, the charge/discharge current I and the charge/discharge time T of the secondary battery 12 in cooperation with a voltage/current detecting unit (described later on), a storage means for storing the terminal voltage V, the charge/discharge current I and the charge/discharge time T, a control means for controlling the predestinated charge/discharge current Ii flowing to/from the secondary battery 12, and an arithmetic means for arithmetically determining the open-circuit voltage Voc of the secondary battery 12, the polarization resistance R, the life cycle number or the effective charge/discharge cycle repeatable number NL, the residual charge/discharge time Tr and the charge/discharge control voltage VC in cooperation with the current control unit 9 on the basis of the terminal voltage V, the charge/discharge current I, the predestinated charge/discharge current Ii and the charge/discharge time T.

Further, provided are a power source for the current control unit 9 and a voltage/current detecting unit 19 inserted between the secondary battery 12 and the current control unit 9. The voltage/current detecting unit 19 corresponds to the ampere meter 15 and the volt meter 16 mentioned hereinbefore (refer to FIG. 5) and serves to detect the terminal voltage V and the charge/discharge current I of the secondary battery 12. The voltage/current detecting unit 19 constitutes a measuring means in cooperation with the CPU 4 incorporated in the controller 1.

Next, referring to FIG. 10, description will be directed to operation of the charge/discharge control apparatus according to the instant embodiment of the invention. Parenthetically, individual arithmetic operations executed by the charge/discharge control apparatus are illustrated in FIGS. 1, 4 and 7.

Referring to FIG. 10, the terminal voltage V and the charge/discharge current I measured by the voltage/current detecting unit 19 between the secondary battery 12 and the current control unit 9 are supplied to the CPU 4 via the A/D converter 3.

The arithmetic means incorporated in the CPU 4 calculates the integrated power PS, the integrated charge quantity QS and the integrating time interval TS mentioned previously by using the data concerning the time supplied from the timer 5 and the terminal voltage V as well as the charge/discharge current I supplied from the A/D converter 3. The results of the calculation are written in the polarization resistance RAM 7 and the back-up magnetic disk 8.

Furthermore, the arithmetic means incorporated in the CPU 4 reads out the data stored in the back-up magnetic disk 8 onto the RAM 7 to thereby calculate the open-circuit voltage Voc on the basis of the polarization resistance R in the immediately preceding cycle as contained in the data read out onto the RAM 7 and the terminal voltage V as well as the charge/discharge current I detected currently. The results of the calculation are written into the RAM 7 and the back-up magnetic disk 8.

Additionally, the arithmetic means incorporated in the CPU 4 calculates the polarization voltage Vp (=I·R) on the basis of the charge/discharge current I and the polarization resistance R detected currently and compares the open-circuit voltage Voc and the current terminal voltage V with the upper limit open-circuit voltage VcL in the charging process, the lower limit open-circuit voltage VdL in the discharging process and the polarization limit voltage dEL read out onto the RAM 7 from the back-up magnetic disk 8.

More specifically, the above-mentioned arithmetic means compares the open-circuit voltage Voc with the lower limit open-circuit voltage VdL in the discharging process and the upper limit open-circuit voltage VcL in the charging process to thereby determine whether the conditions given by the following expression is satisfied or not.

$$VdL \leq Voc \leq VcL$$

Further, the terminal voltage Vc (=Ii·R) in the charging process is compared with the polarization voltage Vp and the polarization limit voltage dEL to determine whether or not the following condition is satisfied.

$$Vp \leq Vc \leq dEL$$

On the basis of the results of the comparisons mentioned above, the predestinated charge/discharge current Ii which is to flow to or from the secondary battery 12 is determined, whereupon the charge/discharge current I is so controlled that the current control unit 9 coincides with the predestinated charge/discharge current Ii.

The current control unit 9 constituting the control means in cooperation with the CPU 4 controls the current to be supplied to the load 10 from the secondary battery 12 or the predestinated charge current Ii to be supplied to the secondary battery 12 from the charging power source 11.

Upon completion of one charge/discharge cycle, the CPU 4 calculates the up-to-date polarization resistance R to thereby replace the polarization resistance R stored in the polarization resistance RAM 7 by the up-to-date value. Similarly, the corresponding data stored in the back-up magnetic disk 8 is equally updated.

Additionally, the arithmetic means incorporated in the CPU 4 performs the polynomial approximating extrapolation based on a method of least squares in accordance with the expression (6) to thereby calculate the effective charge/discharge cycle repeatable number (life cycle number) NL. The CPU 4 may be so arranged as to execute the arithmetic processings mentioned above on a time division basis or in parallel.

On the other hand, the upper limit open-circuit voltage VcL in the charging process, the lower limit open-circuit voltage VdL in the discharging process, the polarization limit voltage dEL and the limit polarization resistance RL adopted as the control conditions are inputted, for example, by using a keyboard of the input apparatus 2 to be stored in the RAM 7 and the back-up magnetic disk 8.

As is apparent from the above description, by carrying out the methods for measuring the open-circuit voltage Voc and the polarization resistance R as well as the charge/discharge control apparatus and the life cycle number estimating method by using the parameter measuring method with the aid of the charge/discharge control apparatus according to the instant embodiment of the invention to thereby perform the charge/discharge control of the secondary battery 12, the overcharge which causes the open-circuit voltage to exceed the upper limit open-circuit voltage VcL in the charging process as well as the overdischarge which causes the open-circuit voltage to lower below the lower limit open-circuit voltage VdL in the discharging process can be positively prevented from occurring during the charge/discharge control of the secondary battery 12, even when the value of the polarization resistance R intrinsic to the secondary battery 12 varies during the charge/discharge cycle.

Besides, because the charging exceeding or lowering the polarization voltage above or below the polarization limit voltage dEL can successfully be excluded from taking place, occurrence of the secondary reaction can be prevented.

Embodiment 5

In the case of the fourth embodiment mentioned above, no consideration is paid to the type of the secondary battery 12. However, the concept of the present invention can be applied very profitably to the lithium secondary battery which exhibits excellent charge/discharge characteristics among others.

In this case, the upper limit open-circuit voltage VcL in the charging process is fixed at 4.2 volts, the lower limit open-circuit voltage VdL in the discharging process is set at 0.5 volt and the limit polarization resistance RL is fixed at 3.5 ohms. These control condition data may previously be written in the ROM 6 incorporated in the controller 1. In that case, the input apparatus 2 can be omitted.

Embodiment 6

In conjunction with the fourth embodiment of the invention, description has been made only of the charge/discharge control apparatus for the secondary battery. However, it should be mentioned that an electric power storage apparatus of high efficiency can be implemented by adopting the concept underlying the apparatus according to the fourth embodiment of the invention.

Figure 11:
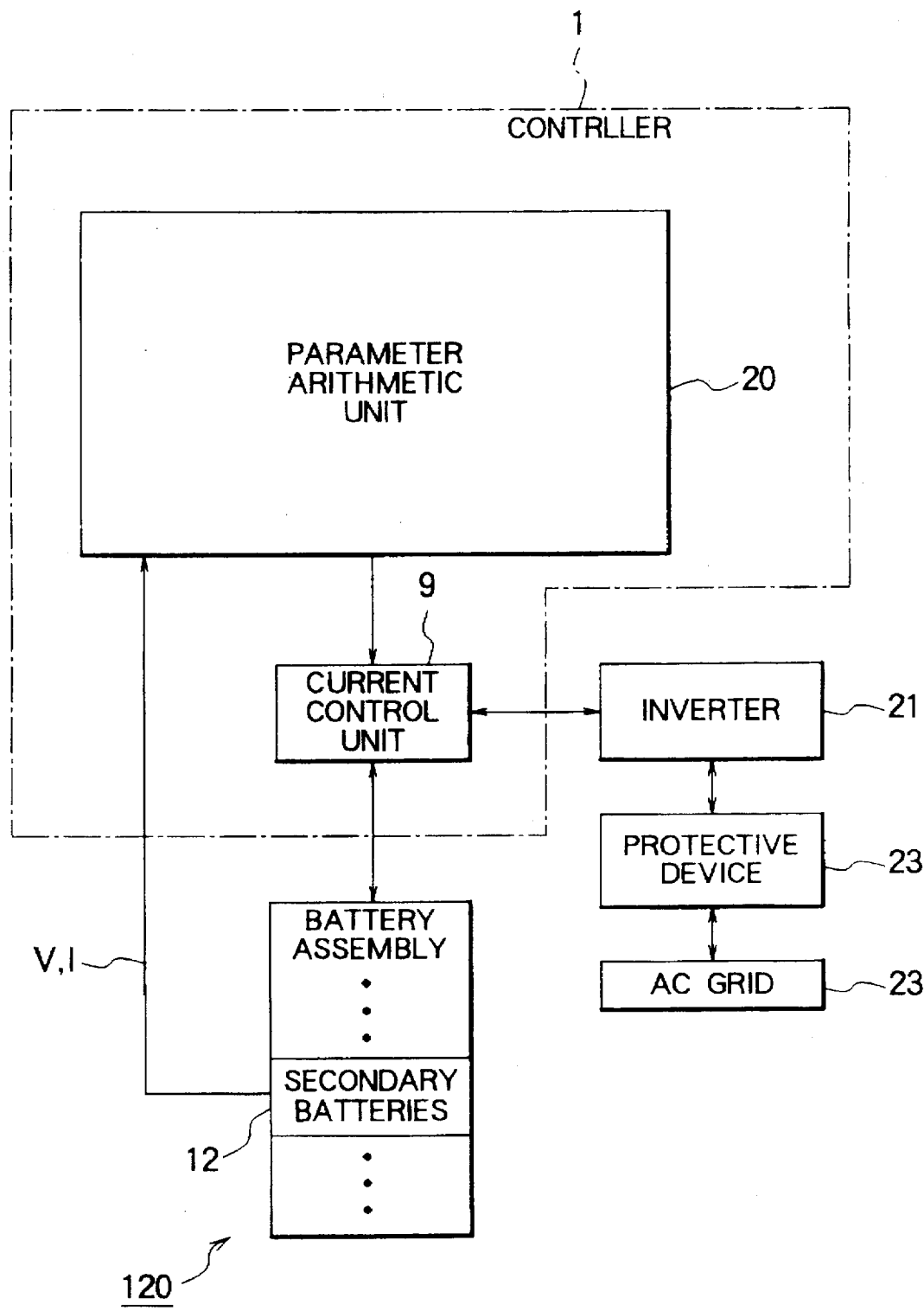
FIG. 11 is a block diagram showing an electric energy storage apparatus according to a sixth embodiment of the present invention.

FIG. 11 is a block diagram showing an electric power storage apparatus according to a sixth embodiment of the present invention. In FIG. 11, reference numerals 1, 9 and 12 denote parts same as or equivalent to those designated by like reference numerals in the preceding embodiments.

Referring to FIG. 11, a battery assembly 120 is constituted by a plurality of individual secondary batteries 12 (e.g. sixty secondary batteries) connected in series to one another. A parameter arithmetic unit 20 is provided for arithmetically determining the polarization resistance R and the open-circuit voltage Voc on the basis of the charge/discharge current I and the terminal voltage V detected from a given one secondary battery 12 of the battery assembly 120. The parameter arithmetic unit 20 is constituted by the CPU 4, the RAM 7 and others (see FIG. 10). Incidentally, it should be mentioned that detecting means for detecting the terminal voltage V and the charge/discharge current I are provided, respectively, in association with the output terminal of the secondary battery 12, although the detecting means is omitted from illustration.

An inverter 21 is provided for converting between DC power and AC power. The inverter 21 is connected to the current control unit 9 incorporated in the controller 1. A protective device 22 is provided in association with the inverter 21 for inhibiting excessive power supply to the inverter 21. An AC power supply network, i.e., an AC (alternating current) grid 23 is connected to the protective device 22, wherein the AC power of a commercial AC source is supplied to the inverter 21 via the protective device 22. Of course, the AC grid 23 also serves as a load to which the AC power outputted from the inverter 21 is supplied via the protective device 22.

The inverter 21 converts an AC power supplied from the AC grid 23 into a DC power which is then stored in the battery assembly 120 constituted by a plurality of secondary batteries 12. On the other hand, the DC power stored in the battery assembly 120 is converted into an AC power by the inverter 21 to be supplied to the AC grid 23.

In that case, the controller 1 serves as the charge/discharge control apparatus of the electric energy storage apparatus.

In the electric energy storage apparatus shown in FIG. 11, the inverter 21 converts the night time AC power to a DC power to be stored in the battery assembly 120 via the current control unit 9. On the other hand, during a daytime period in which the power is consumed, the DC power stored in the battery assembly 120 is converted to the AC power by the inverter to be supplied to the AC grid 23 now functioning as a load. At that time, the parameter arithmetic unit 20 incorporated in the controller 1 measures the terminal voltage V and the charge/discharge current I of one secondary battery 12 selected arbitrarily from the battery assembly 120, whereon the parameter arithmetic unit 20 arithmetically determines the polarization resistance R and the open-circuit voltage Voc on the basis of the terminal voltage V and the charge/discharge current I to thereby allow the current control unit 9 to perform the control described previously.

In the case of the instant embodiment of the invention, the lithium ion type lithium secondary batteries each having a capacity of e.g. 70 Ah (ampere-hour) is employed as the individual secondary batteries which constitute the battery assembly 120, while the charge/discharge control apparatus dedicated only to the control of the lithium secondary battery is employed as the controller 1 for controlling the battery assembly 120. Thus, the electric power storage enjoying high efficiency can be implemented without impairing the use life of the secondary battery 12.

Further, because the charge/discharge control can be accomplished on the basis of the polarization resistance R and the open-circuit voltage Voc which can easily be measured, the charge/discharge cycle life NC of the secondary battery 12 (inter alia, the life of the lithium secondary battery) can be extended.

The various control conditions mentioned hereinbefore are determined on the assumption that the secondary battery 12 is the lithium ion type lithium secondary battery. It goes without saying that these control conditions may be altered in dependence on the types of the secondary battery 12 or in consideration of improvement of performances of the secondary battery 12 in the future. Thus, even when the secondary battery 12 of different types are of concern or when the performance of the secondary battery is improved or enhanced, this can easily be accommodated by changing correspondingly the control conditions or by exchanging the ROM 6 storing these control conditions with an updated ROM.

Many modifications and variations of the present invention are possible in the light of the above techniques. It is therefore to be understood that within the scope of the appended claims, the invention may be practiced otherwise than as specifically described.

What is claimed is:

1. A parameter measuring method for measuring parameters of a secondary battery, comprising the steps of:
   measuring and storing a terminal voltage, a charge/discharge current and a charge/discharge time of said secondary battery in charge/discharge cycles of said battery;
   arithmetically determining an integrated power, an integrated charge quantity and an integrating time interval over a period extending from a start of a charge/discharge process to an end thereof in an immediately preceding cycle;
   determining a mean terminal voltage including a mean terminal voltage in a charging process and a mean terminal voltage in a discharging process by dividing said integrated power by said integrated charge quantity;
   determining a mean current including a mean charge current and a mean discharge current by dividing said integrated charge quantity by said integrating time interval;
   determining a polarization resistance of said secondary battery on the basis of said mean terminal voltage and said mean current by using a battery polarization resistance model; and
   determining an open-circuit voltage of said secondary battery on the basis of said polarization resistance.

2. A parameter measuring method for measuring parameters of a secondary battery according to claim 1, wherein said secondary battery is a lithium secondary battery.

3. A method of controlling charge/discharge of a secondary battery by using a parameter measuring method according to claim 1, comprising the steps of:
   controlling a predestinated charge/discharge current which is to flow to and from, respectively, said secondary battery on the basis of said polarization resistance and said open-circuit voltage and a predetermined upper limit open-circuit voltage in the charging process, a predetermined lower limit open-circuit voltage in the discharging process and a polarization limit voltage such that a charge/discharge control voltage given as a product of a predestinated charge/discharge current flowing to and from, respectively, said second battery, and the polarization resistance, does not exceed said polarization limit voltage;
   determining a residual capacity of said secondary battery on the basis of said open-circuit voltage;
   arithmetically determining a residual charge/discharge time of said secondary battery on the basis of said residual capacity and said predestinated charge/discharge current; and
   terminating a charge/discharge process of said secondary battery within said residual charge/discharge time such that, in the discharging process, said open-circuit voltage does not drop below said lower limit open-circuit voltage, while in the charging process, said open-circuit voltage does not exceed said upper limit open-circuit voltage.

4. A method of predicting a life of said secondary battery by using a parameter measuring method according to claim 1, comprising the steps of:
   storing changes occurring in said polarization resistance in a plurality of charge/discharge cycles of said secondary battery;
   performing a polynomial approximating extrapolation based on a method of least squares, as a function of a charge/discharge cycle repetition number of said secondary battery; and
   determining as an effective charge/discharge cycle repeatable number the charge/discharge cycle repetition number at a time point when said polarization resistance attains a polarization resistance limit.

5. A charge/discharge control apparatus for a secondary battery, comprising:
   a measuring means for measuring a terminal voltage, a charge/discharge current and a charge/discharge time of the secondary battery;
   memory means for storing said terminal voltage, said charge/discharge current and said charge/discharge time;
   control means for controlling a predestinated charge/discharge current which is to flow to and from, respectively, said secondary battery; and
   arithmetic means for arithmetically determining an open-circuit voltage, a polarization resistance thereof, a life cycle number, a residual charge/discharge time and a charge/discharge control voltage, respectively, of said secondary battery on the basis of said terminal voltage, said charge/discharge current, said predestinated charge/discharge current and said charge/discharge time.

6. A secondary battery control apparatus according to claim 5, wherein said secondary battery is a lithium secondary battery.

7. An apparatus for storing electric energy, comprising:

measuring means for measuring a terminal voltage, a charge/discharge current and a charge/discharge time of a secondary battery;

memory means for storing said terminal voltage, said charge/discharge current and said charge/discharge time;

control means for controlling a predestinated charge/discharge current which is to flow to and from, respectively, said secondary battery;

arithmetic means for arithmetically determining an open-circuit voltage, a polarization resistance thereof, a life cycle number, a residual charge/discharge time and a charge/discharge control voltage, respectively, of said secondary battery on the basis of said terminal voltage, said charge/discharge current, said predestinated charge/discharge current and said charge/discharge time; and electric power conversion means for convening an AC electric power into a DC power, and for storing said DC power in said secondary battery.

8. An apparatus for measuring parameters of a secondary battery, comprising:

means for measuring and storing a terminal voltage, a charge/discharge current and a charge/discharge time of said secondary battery in charge/discharge cycles of said battery;

means for arithmetically determining an integrated power, an integrated charge quantity and an integrating time interval over a period extending from a start of a charge/discharge process to an end thereof in an immediately preceding cycle;

means for determining a mean terminal voltage including a mean terminal voltage in a charging process and a mean terminal voltage in a discharging process by dividing said integrated power by said integrated charge quantity;

means for determining a mean current including a mean charge current and a mean discharge current by dividing said integrated charge quantity by said integrating time interval;

means for determining a polarization resistance of said secondary battery on the basis of said mean terminal voltage and said mean current by using a battery polarization resistance model; and means for determining an open-circuit voltage of said secondary battery on the basis of said polarization resistance.

9. The apparatus for measuring parameters of a secondary battery according to claim 8, wherein said secondary battery is a lithium secondary battery.

10. The apparatus for measuring parameters of a secondary battery according to claim 8, further including means for controlling charge/discharge of said secondary battery, comprising:

means for controlling a predestinated charge/discharge current which is to flow to and from, respectively, said secondary battery on the basis of said polarization resistance and said open-circuit voltage and a predetermined upper limit open-circuit voltage in the charging process, a predetermined lower limit open-circuit voltage in the discharging process and a polarization limit voltage such that a charge/discharge control voltage given as a product of a predestinated charge/discharge current flowing to and from, respectively, said second battery, and the polarization resistance, does not exceed said polarization limit voltage;

means for determining a residual capacity of said secondary battery on the basis of said open-circuit voltage;

means for arithmetically determining a residual charge/discharge time of said secondary battery on the basis of said residual capacity and said predestinated charge/discharge current; and means for terminating a charge/discharge process of said secondary battery within said residual charge/discharge time such that, in the discharging process, said open-circuit voltage does not drop below said lower limit open-circuit voltage, while in the charging process, said open-circuit voltage does not exceed said upper limit open-circuit voltage.

11. The apparatus for measuring parameters of a secondary battery according to claim 8, further including means for predicting a life of said secondary battery, comprising:

means for storing changes occurring in said polarization resistance in a plurality of charge/discharge cycles of said secondary battery;

means for performing a polynomial approximating extrapolation based on a method of least squares, as a function of a charge/discharge cycle repetition number of said secondary battery; and means for determining as an effective charge/discharge cycle repeatable number the charge/discharge cycle repetition number at a time point when said polarization resistance attains a polarization resistance limit.

* * * * *